United States Patent
Lin et al.

(10) Patent No.: US 11,061,072 B2
(45) Date of Patent: Jul. 13, 2021

(54) SYSTEM CHIP, AND BUILT-IN SELF-TEST CIRCUIT AND SELF-TEST METHOD THEREOF

(71) Applicant: Realtek Semiconductor Corp., HsinChu (TW)

(72) Inventors: I-Hsueh Lin, Hsinchu County (TW); Chia-Min Liu, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 218 days.

(21) Appl. No.: 16/414,720

(22) Filed: May 16, 2019

(65) Prior Publication Data
US 2020/0096565 A1 Mar. 26, 2020

(30) Foreign Application Priority Data
Sep. 25, 2018 (TW) ................................. 107133545

(51) Int. Cl.
*G01R 31/317* (2006.01)
(52) U.S. Cl.
CPC . *G01R 31/31724* (2013.01); *G01R 31/31718* (2013.01)

(58) Field of Classification Search
CPC ............ G01R 31/31724; G01R 31/317; G01R 31/31717; G01R 31/31715; G01R 31/31703; G01R 31/31716; G01R 31/31718; G01R 31/3187; G01R 31/3181
See application file for complete search history.

(56) References Cited

U.S. PATENT DOCUMENTS

| 2015/0180595 A1* | 6/2015 | Dhayni | H04B 17/14 |
| | | | 375/224 |
| 2016/0204881 A1* | 7/2016 | Chung | H04B 17/00 |
| | | | 455/67.14 |

FOREIGN PATENT DOCUMENTS

CN 101336519 A 12/2008

\* cited by examiner

*Primary Examiner* — Lee E Rodak
(74) *Attorney, Agent, or Firm* — Winston Hsu (57) ABSTRACT

A system chip, and a built-in self-test circuit and a self-test method thereof are provided. The system chip includes an analog front end circuit, a digital physical layer circuit and a built-in self-test circuit. The digital physical layer circuit is coupled to the analog front end circuit, and the built-in self-test circuit is coupled to the digital physical layer circuit and is arranged to test the analog front end circuit with aid of the digital physical layer circuit.

12 Claims, 6 Drawing Sheets

SYSTEM CHIP, AND BUILT-IN SELF-TEST CIRCUIT AND SELF-TEST METHOD THEREOF

BACKGROUND OF THE INVENTION

1. Field of the Invention

The present invention is related to system chip test, and more particularly, to a system chip, and a built-in self-test circuit and a self-test method thereof.

2. Description of the Prior Art

Most of modules within a system chip need to be enabled in order to perform a test or verification of an analog front end (AFE) circuit within the system chip. For example, a memory such as a dynamic random access memory (DRAM) needs to be enabled to store program code(s) corresponding to a test flow, and a central processing unit (CPU) may run the program code(s) to control other modules to operate accordingly during the test flow. As a result, additional costs and long setting time may be needed for mass production. Thus, there is a need for a novel chip architecture and associated test method, in order to improve efficiency of system chip testing.

SUMMARY OF THE INVENTION

An objective of the present invention is to provide a system chip, and built-in self-test circuit and self-test method thereof, to solve the aforementioned problems.

Another objective of the present invention is to provide a system chip, and built-in self-test circuit and self-test method thereof, to improve the efficiency of system chip testing without introducing a side effect or in a way that is less likely to introduce a side effect.

At least one embodiment of the present invention provides a system chip, where the system chip may comprise an AFE circuit, a digital physical layer (PHY) circuit and a built-in self-test (BIST) circuit. The digital PHY circuit is coupled to the AFE circuit, and the BIST circuit is coupled to the digital PHY circuit and arranged to perform a test on the AFE circuit with aid of the digital PHY circuit. For example, during the test, the BIST circuit generates a first input signal, and transmits the first input signal to the digital PHY circuit. The digital PHY circuit generates a second input signal according to the first input signal, and transmits the second input signal to the AFE circuit. The AFE circuit generates a first output signal according to the second output signal, and transmits the first output signal to the digital PHY circuit. The digital PHY circuit generates a second output signal according to the first output signal, and transmits the second output signal to the BIST circuit. The BIST circuit generates one or more test results according to the second output signal, to determine whether the AFE circuit passes the test. In addition, the first input signal and the second output signal are signals in frequency domain, and the second input signal and the first output signal are signals in time domain.

At least one embodiment of the present invention provides a BIST circuit applicable to a system chip, where the system chip may comprise an AFE circuit, a digital PHY circuit and the BIST circuit, and the BIST circuit may comprise a central control unit (CCU) that is arranged to control the BIST circuit, to perform a test on the AFE circuit with aid of the digital PHY circuit. For example, during the test, the BIST circuit generates a first input signal, and transmits the first input signal to the digital PHY circuit. The digital PHY circuit generates a second input signal according to the first input signal, and transmits the second input signal to the AFE circuit. The AFE circuit generates a first output signal according to the second output signal, and transmits the first output signal to the digital PHY circuit. The digital PHY circuit generates a second output signal according to the first output signal, and transmits the second output signal to the BIST circuit. The BIST circuit generates one or more test results according to the second output signal, to determine whether the AFE circuit passes the test. In addition, the first input signal and the second output signal are signals in frequency domain, and the second input signal and the first output signal are signals in time domain.

At least one embodiment of the present invention provides a self-test method of a system chip. The self-test method comprises: inputting setting parameters and one or more determination conditions of a test on an AFE circuit within the system chip to a BIST circuit; utilizing the BIST circuit to generate a first input signal, and transmit the first input signal to the digital PHY circuit; utilizing the digital PHY circuit to generate a second input signal according to the first input signal, and transmit the second input signal to the AFE circuit; utilizing the AFE circuit to generate a first output signal according to the second output signal, and transmit the first output signal to the digital PHY circuit; utilizing the digital PHY circuit to generate a second output signal according to the first output signal, and transmits the second output signal to the BIST circuit; and utilizing the BIST circuit to generate one or more test results according to the second output signal, to determine whether the AFE circuit passes the test. In addition, the first input signal and the second output signal are signals in frequency domain, and the second input signal and the first output signal are signals in time domain.

One of advantages of the present invention is, the present invention system chip, and more particularly, BIST circuit and self-test method thereof, can improve speed of the test flow during the quantity production. In addition, implementing according to embodiments of the present invention will not greatly increase additional costs. Thus, the related art problems can be solved without greatly increasing overall costs. In comparison with the related art, the present invention can improve the efficiency of system chip testing without introducing a side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
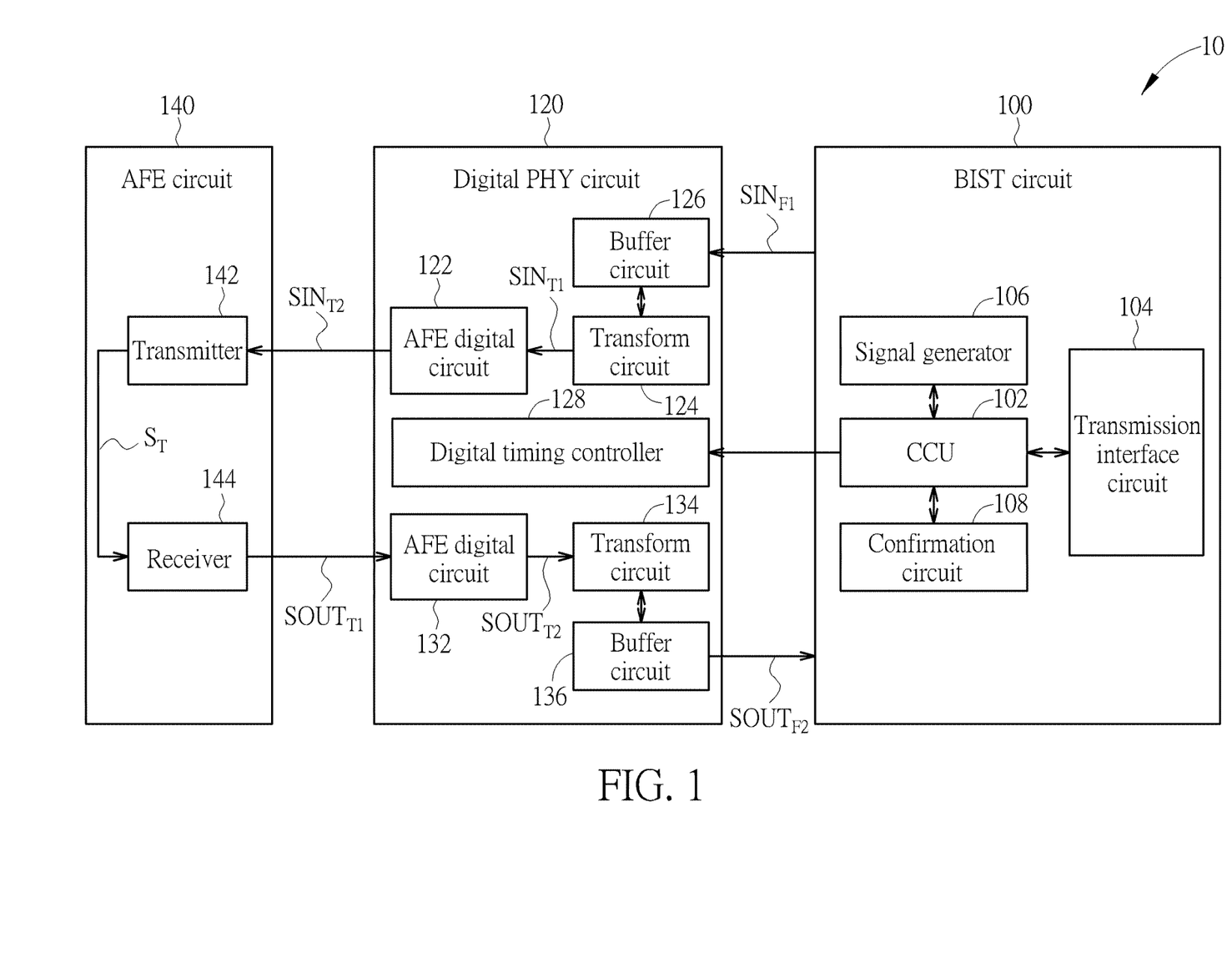
FIG. 1 is a diagram illustrating a system chip according to an embodiment of the present invention.

FIG. 1 is a diagram illustrating a system chip 10 according to an embodiment of the present invention. As shown in FIG. 1, the system chip may comprise an AFE circuit 140, a digital PHY circuit 120 coupled to the AFE circuit 140, and a BIST circuit 100. The BIST circuit 100 may comprise a CCU 102, a transmission interface circuit 104, a signal generator 106 and a confirmation circuit 108 (e.g. a power spectrum density (PSD) confirmation circuit), where the transmission interface circuit 104, the signal generator 106 and the confirmation circuit 108 are coupled to the CCU 102, respectively. Additionally, examples of the transmission interface circuit 104 may include, but not limited to: a Universal Asynchronous Receiver/Transmitter (UART) conforming to RS-232 specification. The digital PHY circuit 120 may comprise AFE digital circuits 122 and 132 (e.g. AFE digital-part digital signal processing front end (AFE-D DSP-FE) circuits that are respectively arranged to perform up-sampling and down-sampling), a transform circuit 124 (e.g. an Inverse Fast Fourier Transform (IFFT) circuit) coupled to the AFE digital circuit 122, a transform circuit 134 (e.g. a Fast Fourier Transform (FFT) circuit) coupled to the AFE digital circuit 132, a buffer circuit 126 (e.g. a transmitter (TX) buffer circuit) coupled to the transform circuit 124, a buffer circuit 136 (e.g. a receiver (RX) buffer circuit) coupled to the transform circuit 134, and a digital timing controller 128 (e.g. a digital system timing unit (DSTU)). In addition, the AFE circuit 140 may comprise a transmitter 142 (e.g. an AFE analog-part (AFE-A) TX) and a receiver 144 (e.g. an AFE-A RX), but the present invention is not limited thereto.

In an embodiment, the CCU 102 may receive setting parameters and one or more determination conditions from outside (e.g. outside of the system chip 10) through the transmission interface circuit 104, and control the BIST circuit 100 and the digital PHY circuit 120 (or the digital timing controller 128) to perform corresponding operations according to the setting parameters. In some embodiments, the digital timing controller 128 may be coupled to one or more circuits within the digital PHY circuit 120 through a bus (not shown), but the present invention is not limited thereto.

Figure 2:
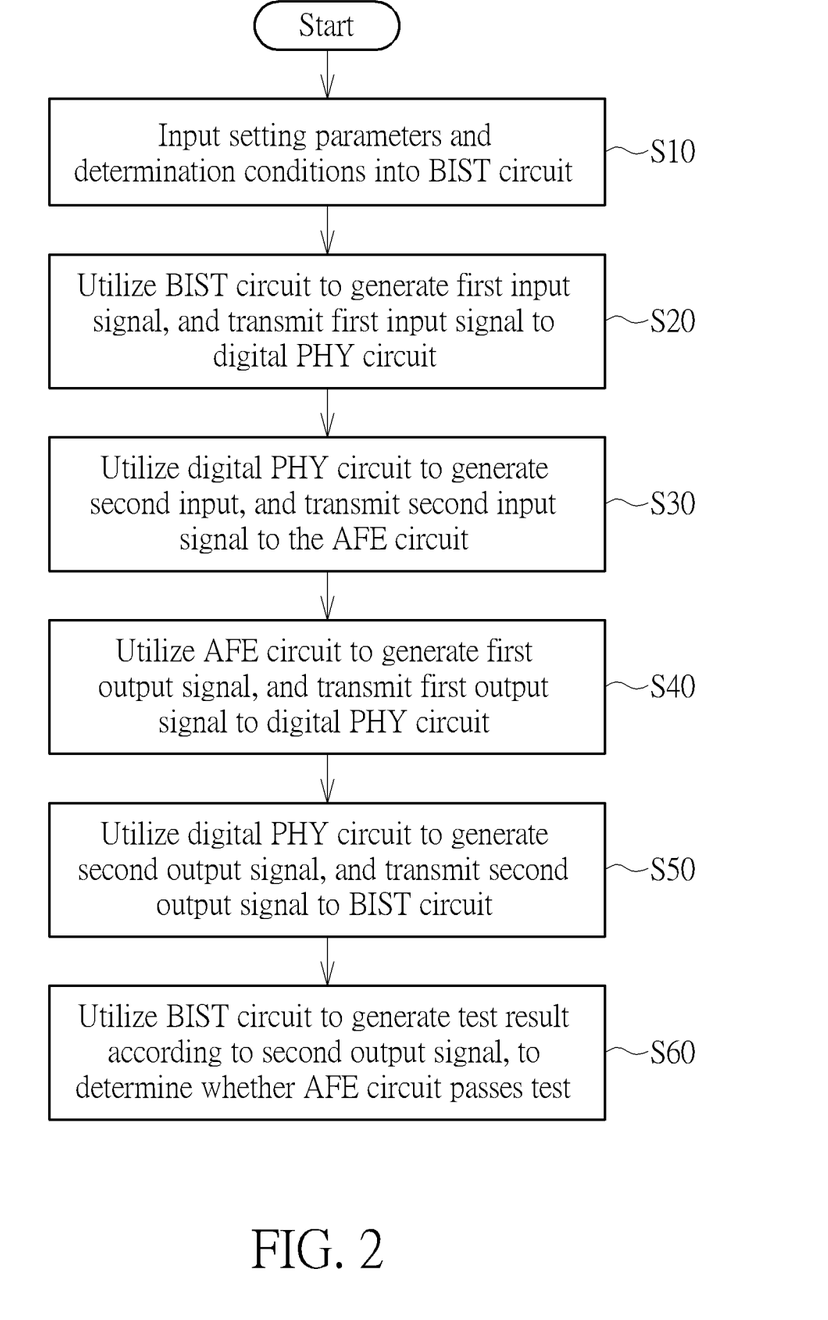
FIG. 2 is a flowchart illustrating a self-test method of the system chip according to an embodiment of the present invention.

FIG. 2 is a flowchart illustrating a self-test method of the system chip 10 according to an embodiment of the present invention. The BIST circuit 100 may perform a test on the AFE circuit 140 with aid of the digital PHY circuit 120, where the self-test method may be illustrated as the following steps during the test.

In Step S10, the BIST circuit 100 may receive the setting parameters and the one or more determination conditions that are needed for the test of the AFE circuit 140 from outside through the transmission interface circuit 104. For example, a test engineer may input the setting parameters and the one or more determination conditions into the BIST circuit 100 through a test control system (e.g. personal computer, which may run a test control program code corresponding to the self-test method), but the present invention is not limited thereto.

Figure 3:
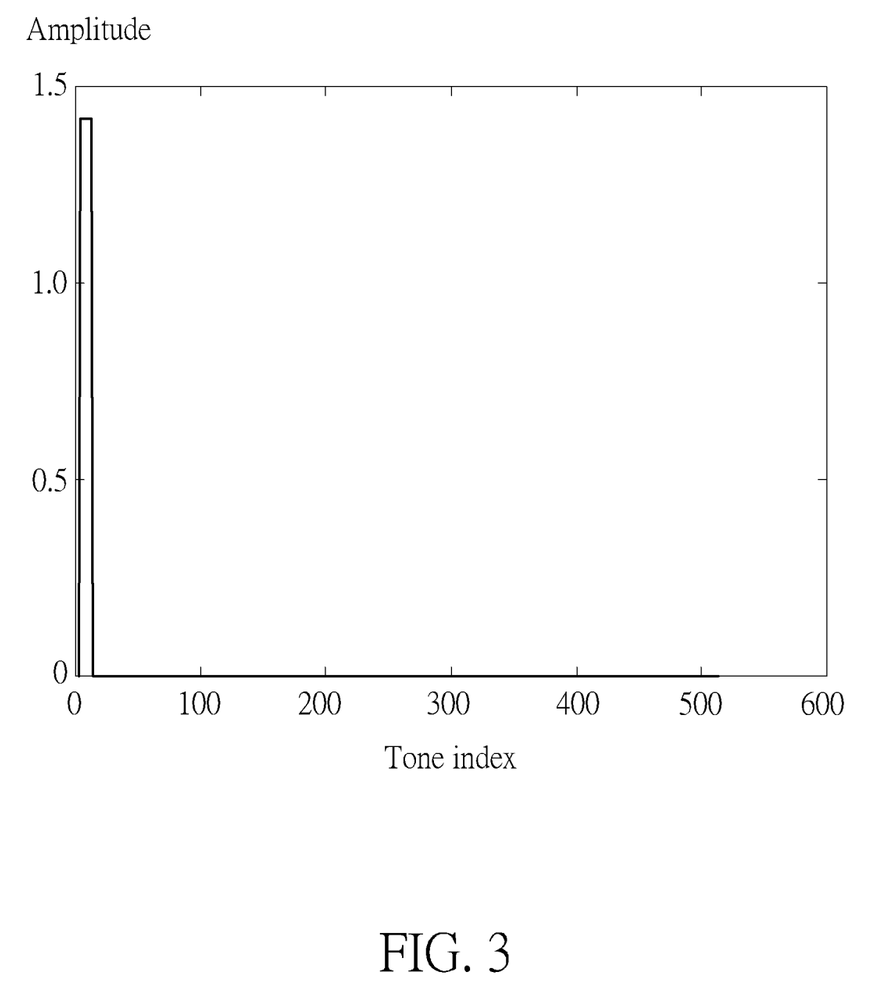
FIG. 3 is a diagram illustrating a first input signal according to an embodiment of the present invention.

In Step S20, the BIST circuit 100 may generate a first input signal such as a signal $SIN_{F1}$ as shown in FIG. 1, and transmit the first input signal to the digital PHY circuit 120. The CCU 102 may control the signal generator 106 to generate the signal $SIN_{F1}$ according to the setting parameters, where the signal $SIN_{F1}$ is a signal in frequency domain. FIG. 3 is a diagram illustrating the first input signal such as the signal $SIN_{F1}$ according to an embodiment of the present invention, where the horizontal axis and the vertical axis shown in FIG. 3 may represent tone indexes and relative magnitudes of amplitudes corresponding to respective tones of the signal $SIN_{F1}$, respectively. In some embodiments, the CCU 102 may control the signal generator 106 to directly transmit the signal $SIN_{F1}$ to the digital PHY circuit 120; or, the CCU 102 may receive the signal $SIN_{F1}$ generated by the signal generator 106, and then transmit the signal $SIN_{F1}$ to the digital PHY circuit 120 through a bus, but the present invention is not limited thereto.

Figure 4:
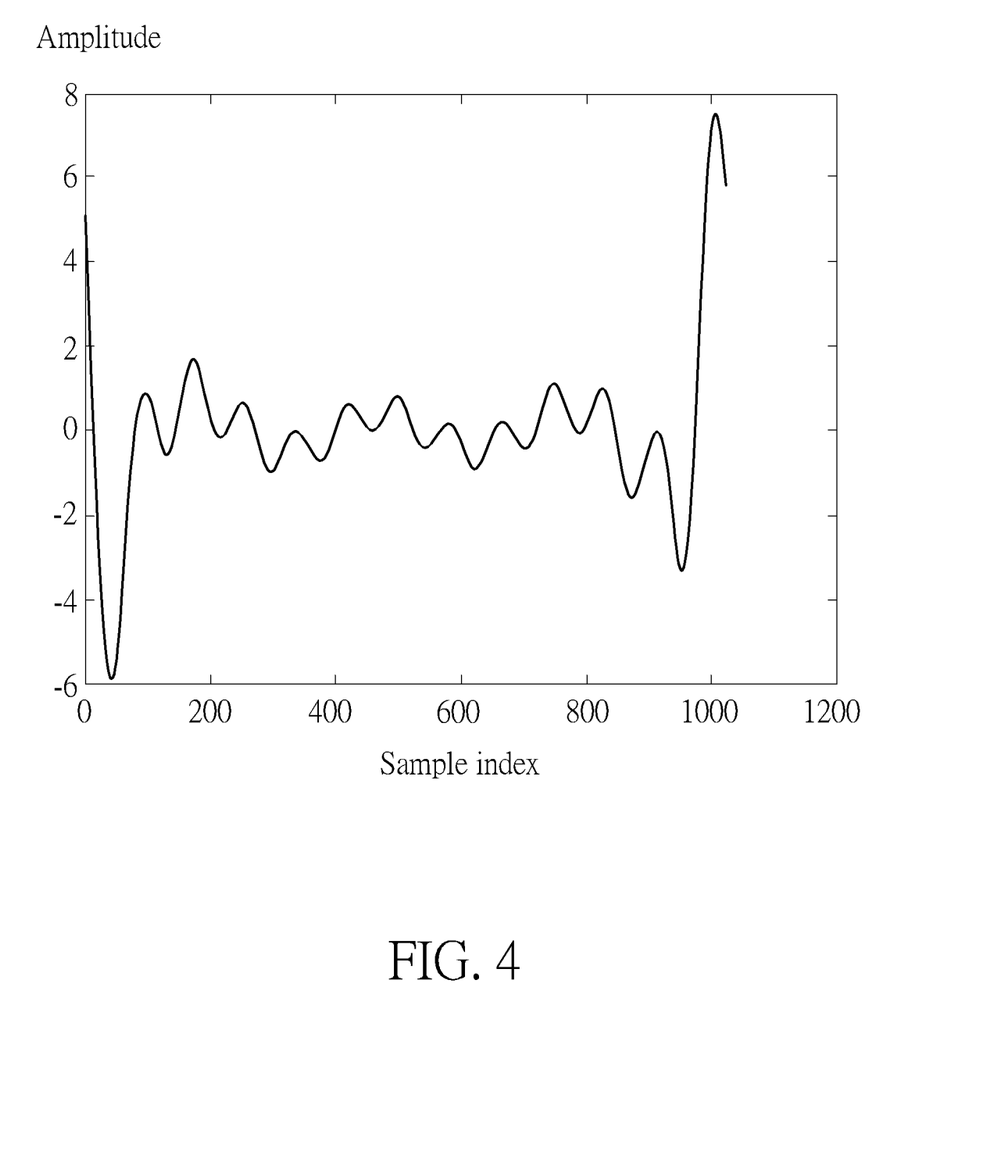
FIG. 4 is a diagram illustrating a signal from a transform circuit according to an embodiment of the present invention.

In Step S30, the digital PHY circuit 120 may generate a second input signal such as a signal $SIN_{T2}$ according to the first input signal such as the signal $SIN_{F1}$ shown in FIG. 1, and transmit the second input signal to the AFE circuit 140. The buffer circuit 126 may buffer the signal $SIN_{F1}$, and then the transform circuit 124 may transform the signal $SIN_{F1}$ into a signal $SIN_{T1}$ in time domain (e.g. by IFFT). FIG. 4 is a diagram illustrating the signal $SIN_{T1}$ from the transform circuit 124 according to an embodiment of the present invention, for example, the signal $SIN_{T1}$ may be generated through performing IFFT on the signal $SIN_{F1}$ shown in FIG. 3, where the horizontal axis and the vertical axis shown in FIG. 4 may represent sample indexes and relative magnitudes of amplitudes corresponding to respective samples of the signal $SIN_{T1}$, respectively, and energy of each of respective samples is proportional to square of corresponding amplitude. For example, the AFE digital circuit 122 may perform up-sampling on the signal $SIN_{T1}$ from the transform circuit 124 according to specification (s) of the AFE circuit 140, to generate the signal $SIN_{T2}$. For another example, the AFE digital circuit 122 may directly generate the signal $SIN_{T2}$ without performing up-sampling on the signal $SIN_{T1}$.

Figure 5:
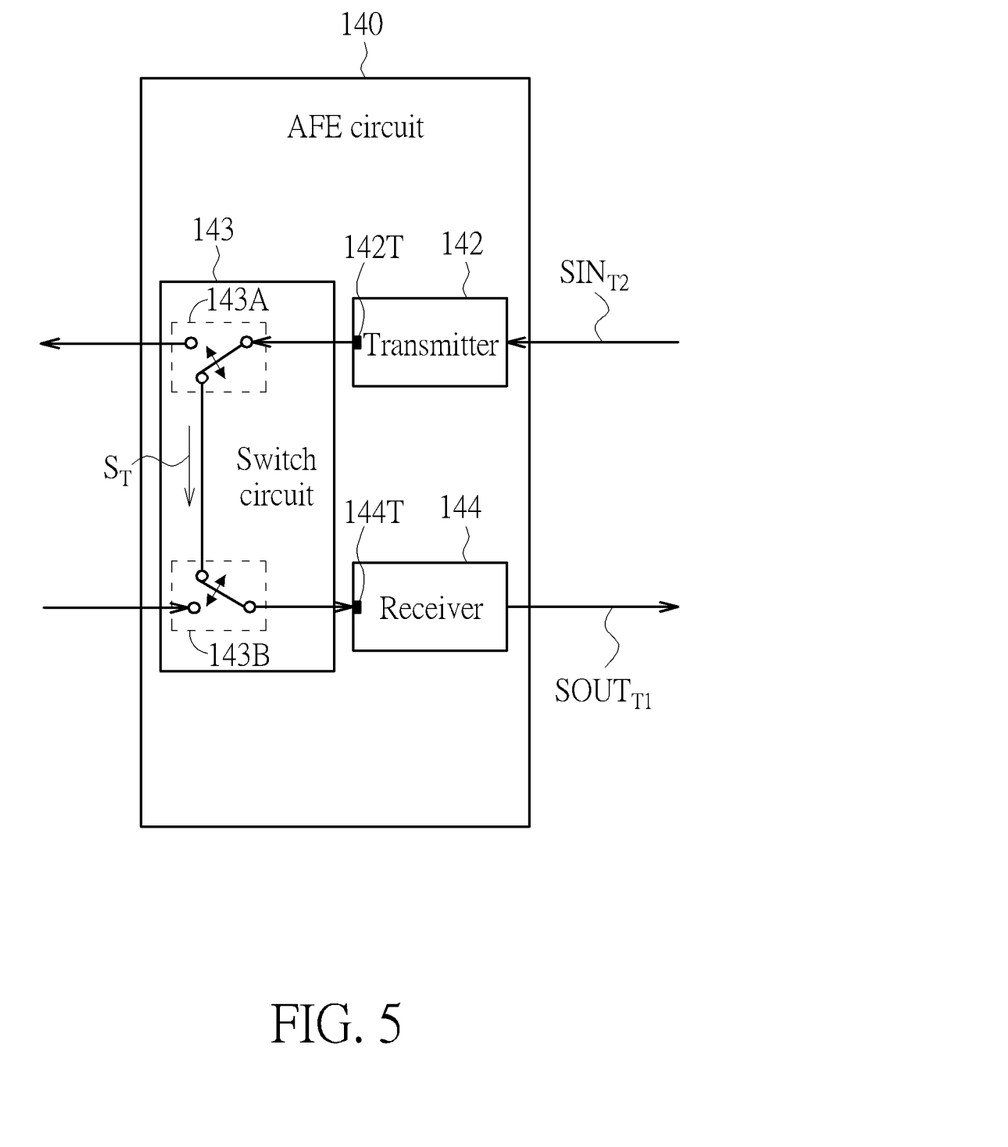
FIG. 5 illustrates an example of a configuration of an AFE circuit shown in FIG. 1.

In Step S40, the AFE circuit 140 may generate a first output signal such as a signal $SOUT_{T1}$ according to the second input signal such as the $SIN_{T2}$, and transmit the first output signal to the digital PHY circuit 120. When the BIST circuit 100 performs the test on the AFE circuit 140, based on a configuration (such as that shown in FIG. 5) of the AFE circuit 140, a receiving terminal 144T of the receiver 144 may be coupled to a transmitting terminal 142T of the transmitter 142 (e.g. through switches 143A and 143B within a switch circuit 143), to receive a transmitted signal on the transmitting terminal 142T to be a received signal on the receiving terminal 144T. Thus, after the transmitter 142 receives the signal $SIN_{T2}$, the receiver 144 may receive a signal $S_T$ from the transmitter 142, and transmit the signal $SOUT_{T1}$ to the digital PHY circuit 120.

Figure 6:
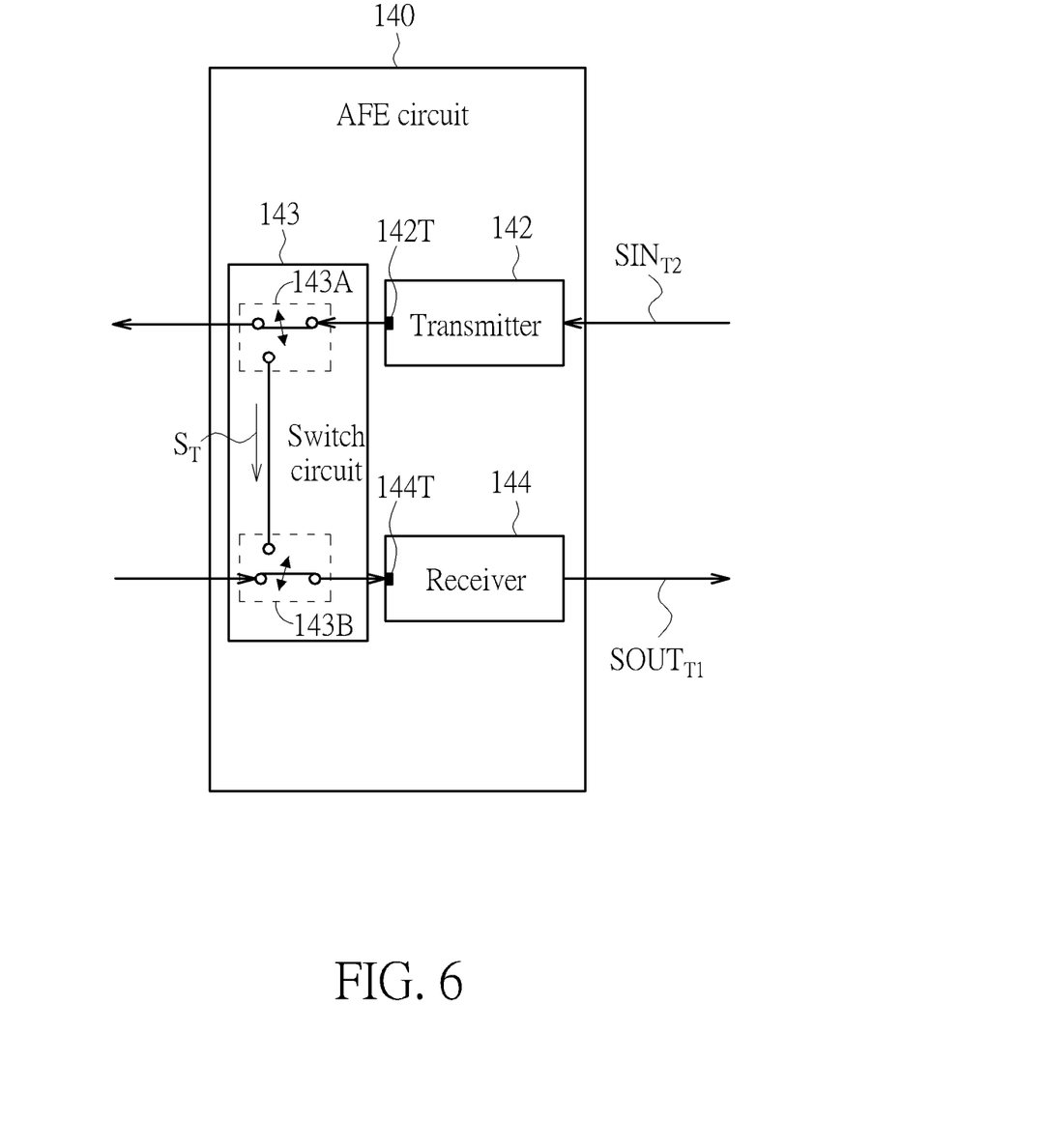
FIG. 6 illustrates an example of another configuration of the AFE circuit shown in FIG. 1.

In addition, in a condition of a normal operation (rather than a test mode), based on another configuration (such as that shown in FIG. 6) of the AFE circuit 140, the transmitting terminal 142T and the receiving terminal 144T may be coupled to respective transmission terminals (e.g. be coupled to antennas through the switches 143A and 143B within the switch circuit 143) rather than be coupled to each other, to transmit signal(s) to outside or receive signal(s) from outside, but the present invention is not limited thereto.

In Step S50, the digital PHY circuit 120 may generate a second output signal such as a signal $SOUT_{F2}$ according to the first output signal such as the signal $SOUT_{T1}$, and transmit the second output signal to the BIST circuit 100. For example, the AFE digital circuit 132 may perform down-sampling on the signal $SOUT_{T1}$ according to the specification(s), to generate a down-sampled signal $SOUT_{T2}$. For another example, the AFE digital circuit 132 may directly generate the signal $SOUT_{T2}$ without performing down-sampling on the signal $SOUT_{T1}$. The transform circuit 134 may transform the signal $SOUT_{T2}$ from the AFE digital circuit 132 into the second output signal such as the signal $SOUT_{F2}$ in frequency domain (e.g. by FFT), and buffer the signal $SOUT_{F2}$ through the buffer circuit 136 and transmit the signal $SOUT_{F2}$ to the BIST circuit 100. According to the operations of the above steps, the first input signal and the second output signal are signals in frequency domain, and the second input signal and the first output signal are signals in time domain.

In Step S60, the BIST circuit 100 may generate one or more test results according to the second output signal, to determine whether the AFE circuit 140 passes the test. In some embodiments, the CCU 102 may receive the signal $SOUT_{F2}$ from the digital PHY circuit 120 through a bus, and then the CCU 102 may transmit the signal $SOUT_{F2}$ to the confirmation circuit 108 for generating one or more test results; or, the confirmation circuit 108 may directly receive the signal $SOUT_{F2}$ from the digital PHY circuit 120 and generate the one or more test results, but the present invention is not limited thereto. In addition, when the BIST circuit 100 determines whether the AFE circuit 140 passes the test, the confirmation circuit 108 may determine whether the AFE circuit 140 passes the test according to the one or more determination conditions (which are inputted into the BIST circuit 100 in Step S10) and the one or more test results. For example, when a test result such as a signal power to noise power ratio (SNR) does not meet (e.g. achieve) a determination condition of passing the test (e.g. whether the SNR achieve a target value such as 60 dB, where the SNR that achieves the target value means the AFE circuit 140 passes the test), the confirmation circuit 108 may generate a notification signal to indicate failure of the test. For another example, when at least one of multiple test results (such as the SNR, a signal tone power, a transition tone power, a notch tone power and a signal power to average noise power ratio) does not pass corresponding determination condition (e.g. whether a test result falls in a predetermined range, where the test result that falls in the predetermined range means the AFE circuit 140 passes the test), the confirmation circuit 108 may generate the notification signal to indicate the failure of the test. For another example, when all of the aforementioned multiple test results pass corresponding determination conditions, the confirmation circuit 108 will not generate the notification signal; or, the confirmation circuit 108 may generate another notification signal that is different from the notification signal, to indicate a successful test (e.g. the AFE circuit 140 passes the test). In addition to the aforementioned notification signal, the aforementioned multiple test results may also be outputted to the test control system through the transmission interface circuit 104 when the test engineer expects to obtain additional information or details of the test, to allow the test engineer to utilize the test control system to analyze other details within the test.

In addition, in some embodiments, the confirmation circuit 108 may transmit the notification signal to the CCU 102, and then the CCU 102 may transmit the notification signals to outside through the transmission interface circuit 104 or an additional output channel; or, the confirmation circuit 108 may directly transmit the notification signal to outside through an output channel, but the present invention is not limited thereto.

As a result, the test engineer (or a test machine (e.g. the test control system)) may simply determine whether the test of the AFE circuit 140 fails according to whether the confirmation circuit 108 generates the notification signal, and test time of a chip can be greatly reduced during mass production.

The present invention utilizes a BIST circuit within a system chip, to perform the test of an AFE circuit within the system chip. According to the aforementioned self-test method, the BIST circuit may execute corresponding test flow through simple interface control, and therefore the present invention can greatly reduce the test time of the system chip during mass production. Thus, the problems of the related art can be solved, and costs will not greatly increase. In comparison with the related art, the present invention can improve the test efficiency of the system chip without introducing side effects or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A system chip, comprising:
an analog front end (AFE) circuit;
a digital physical layer (PHY) circuit, coupled to the AFE circuit; and
a built-in self-test (BIST) circuit, coupled to the digital PHY circuit, arranged to perform a test on the AFE circuit with aid of the digital PHY circuit, wherein, during the test:
  the BIST circuit generates a first input signal, and transmits the first input signal to the digital PHY circuit;
  the digital PHY circuit generates a second input signal according to the first input signal, and transmits the second input signal to the AFE circuit;
  the AFE circuit generates a first output signal according to the second input signal, and transmits the first output signal to the digital PHY circuit;
  the digital PHY circuit generates a second output signal according to the first output signal, and transmits the second output signal to the BIST circuit; and
  the BIST circuit generates one or more test results according to the second output signal, to determine whether the AFE circuit passes the test;
wherein the first input signal and the second output signal are signals in frequency domain, and the second input signal and the first output signal are signals in time domain;
wherein the digital PHY circuit comprises:
  a transmitter buffer circuit, arranged to buffer the first input signal;
  an Inverse Fast Fourier Transform (IFFT) circuit, coupled to the transmitter buffer circuit, arranged to transform the first input signal into a transformed input signal in time domain;
  a first AFE digital circuit, coupled to the IFFT circuit, arranged to perform up-sampling on the transformed input signal from the IFFT circuit to generate the second input signal;
  a second AFE digital circuit, arranged to perform down-sampling on the first output signal to generate a down-sampled signal;
  a Fast Fourier Transform (FFT) circuit, coupled to the second AFE digital circuit, arranged to transform the down-sampled signal from the second AFE digital circuit into the second output signal in frequency domain; and a receiver buffer circuit, arranged to buffer the second output signal.

2. The system chip of claim 1, wherein the BIST circuit comprises:

a central control unit (CCU), arranged to control the BIST circuit, to perform the test on the AFE circuit with aid of the digital PHY circuit;

a transmission interface circuit, coupled to the CCU, wherein the CCU receives setting parameters and one or more determination conditions from outside through the transmission interface circuit;

a signal generator, coupled to the CCU, wherein the CCU controls the signal generator to generate the first input signal according to the setting parameters; and a confirmation circuit, coupled to the CCU, wherein the CCU transmits the one or more determination conditions to the confirmation circuit, and controls the confirmation circuit to determine whether the AFE circuit passes the test according to the one or more determination conditions and the one or more test results.

3. The system chip of claim 2, wherein the confirmation circuit generates a notification signal in response to a condition that at least one of the one or more test results failing to pass a corresponding determination condition, to indicate failure of the test.

4. The system chip of claim 1, wherein the AFE circuit comprises:

a transmitter, arranged to receive the second input signal; and a receiver, arranged to transmit the first output signal to the digital PHY circuit, wherein a receiving terminal of the receiver is coupled to a transmitting terminal of the transmitter based on a configuration of the AFE circuit, to receive a transmitted signal on the transmitting terminal to be a received signal on the receiving terminal.

5. The system chip of claim 1, wherein the one or more test results comprise a signal power to noise power ratio (SNR).

6. A built-in self-test (BIST) circuit applicable to a system chip, wherein the system chip comprises an analog front end (AFE) circuit, a digital physical layer (PHY) circuit and the BIST circuit, and the BIST circuit comprises:

a central control unit (CCU), arranged to control the BIST circuit, to perform a test on the AFE circuit with aid of the digital PHY circuit, wherein, during the test:

the BIST circuit generates a first input signal, and transmits the first input signal to the digital PHY circuit;

the digital PHY circuit generates a second input signal according to the first input signal, and transmits the second input signal to the AFE circuit;

the AFE circuit generates a first output signal according to the second input signal, and transmits the first output signal to the digital PHY circuit;

the digital PHY circuit generates a second output signal according to the first output signal, and transmits the second output signal to the BIST circuit; and the BIST circuit generates one or more test results according to the second output signal, to determine whether the AFE circuit passes the test;

wherein the first input signal and the second output signal are signals in frequency domain, and the second input signal and the first output signal are signals in time domain;

wherein the digital PHY circuit comprises:

a transmitter buffer circuit, arranged to buffer the first input signal;

an Inverse Fast Fourier Transform (IFFT) circuit, coupled to the transmitter buffer circuit, arranged to transform the first input signal into a transformed input signal in time domain;

a first AFE digital circuit, coupled to the IFFT circuit, arranged to perform up-sampling on the transformed input signal from the IFFT circuit to generate the second input signal;

a second AFE digital circuit, arranged to perform down-sampling on the first output signal to generate a down-sampled signal;

a Fast Fourier Transform (FFT) circuit, coupled to the second AFE digital circuit, arranged to transform the down-sampled signal from the second AFE digital circuit into the second output signal in frequency domain; and a receiver buffer circuit, arranged to buffer the second output signal.

7. The BIST circuit of claim 6, further comprising:

a transmission interface circuit, coupled to the CCU, wherein the CCU receives setting parameters and one or more determination conditions from outside through the transmission interface circuit;

a signal generator, coupled to the CCU, wherein the CCU controls the signal generator to generate the first input signal according to the setting parameters; and a confirmation circuit, coupled to the CCU, wherein the CCU transmits the one or more determination conditions to the confirmation circuit, and controls the confirmation circuit to determine whether the AFE circuit passes the test according to the one or more determination conditions and the one or more test results.

8. The BIST circuit of claim 7, wherein the confirmation circuit generates a notification signal in response to a condition that at least one of the one or more test results failing to pass a corresponding determination condition, to indicate failure of the test.

9. The BIST circuit of claim 6, wherein the one or more test results comprise a signal power to noise power ratio (SNR).

10. A self-test method of a system chip, comprising:

inputting setting parameters and one or more determination conditions of a test on an analog front end (AFE) circuit within the system chip to a built-in self-test (BIST) circuit;

utilizing the BIST circuit to generate a first input signal, and transmit the first input signal to a digital physical layer (PHY) circuit;

utilizing the digital PHY circuit to generate a second input signal according to the first input signal, and transmit the second input signal to the AFE circuit, wherein the step of generating the second input signal according to the first input signal comprises:

transforming the first input signal into a transformed input signal in time domain; and performing up-sampling on the transformed input signal to generate the second input signal;

utilizing the AFE circuit to generate a first output signal according to the second input signal, and transmit the first output signal to the digital PHY circuit;

utilizing the digital PHY circuit to generate a second output signal according to the first output signal, and transmits the second output signal to the BIST circuit, wherein the step of generating the second output signal according to the first output signal comprises:
  performing down-sampling on the first output signal to generate a down-sampled signal; and
  transforming the down-sampled signal into the second output signal in frequency domain; and
utilizing the BIST circuit to generate one or more test results according to the second output signal, to determine whether the AFE circuit passes the test;
wherein the first input signal and the second output signal are signals in frequency domain, and the second input signal and the first output signal are signals in time domain.

11. The self-test method of claim 10, further comprising:
generating a notification signal in response to a condition that at least one of the one or more test results fails to pass a corresponding determination condition, to indicate failure of the test.

12. The self-test method of claim 10, wherein the one or more test results comprise a signal power to noise power ratio (SNR).

\* \* \* \* \*